United States Patent
Hosokawa et al.

(10) Patent No.: US 8,179,185 B2
(45) Date of Patent: May 15, 2012

(54) SAMPLING MIXER, FILTER DEVICE, AND RADIO DEVICE

(75) Inventors: Yoshifumi Hosokawa, Osaka (JP); Noriaki Saito, Tokyo (JP); Katsuaki Abe, Osaka (JP); Kentaro Miyano, Osaka (JP); Yasuyuki Naito, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/115,398

(22) Filed: May 25, 2011

(65) Prior Publication Data

US 2011/0221507 A1  Sep. 15, 2011

Related U.S. Application Data

(62) Division of application No. 12/532,530, filed as application No. PCT/JP2008/000616 on Mar. 17, 2008, now Pat. No. 7,973,586.

(30) Foreign Application Priority Data

Mar. 29, 2007  (JP) ................................ 2007-089446

(51) Int. Cl.
*G06G 7/12*  (2006.01)

(52) U.S. Cl. ......... 327/355; 327/359; 327/361; 455/326

(58) Field of Classification Search ........... 327/355–361
See application file for complete search history.

(56) References Cited

U.S. PATENT DOCUMENTS

| | | | |
|---|---|---|---|
| 6,147,551 A * | 11/2000 | Hong | .............................. 327/554 |
| 7,057,540 B2 | 6/2006 | Muhammad et al. | |
| 7,519,135 B2 | 4/2009 | Staszewski et al. | |
| 7,634,247 B2 | 12/2009 | Joet et al. | |
| 7,822,389 B2 | 10/2010 | Muhammad et al. | |
| 2003/0040294 A1 | 2/2003 | Staszewski et al. | |
| 2003/0050027 A1* | 3/2003 | Muhammad et al. | ......... 455/257 |
| 2003/0080888 A1 | 5/2003 | Muhammad et al. | |
| 2003/0083033 A1 | 5/2003 | Staszewski et al. | |
| 2005/0233725 A1* | 10/2005 | Muhammad et al. | ......... 455/339 |
| 2008/0299937 A1 | 12/2008 | Miyano et al. | |
| 2009/0270061 A1 | 10/2009 | Hosokawa et al. | |
| 2010/0093302 A1* | 4/2010 | Abe et al. | ...................... 455/325 |

FOREIGN PATENT DOCUMENTS

JP   2004-289793 A   10/2004
JP   2006-211153 A   8/2006

OTHER PUBLICATIONS

International Search Report for PCT/JP2008/000616 dated Jun. 17, 2008.

* cited by examiner

*Primary Examiner* — Lincoln Donovan
*Assistant Examiner* — Brandon s Cole
(74) *Attorney, Agent, or Firm* — Pearne & Gordon LLP

(57) ABSTRACT

A sampling mixer includes TAs (transconductance amplifiers), an in-phase mixer section connected to the TA and the TA, an opposite-phase mixer section connected in parallel with the in-phase mixer section, and a signal generator for generating a control signal for the in-phase mixer section and the opposite-phase mixer section respectively. The IIR filter using signals that underwent a current conversion by using the different transconductances is constructed, so that the filter characteristic can be designed by a weighting of the transconductance in addition to a capacitance ratio. As a result, the wide-band filter characteristic and the band-pass filter characteristic can be obtained, and deterioration of the receiving sensitivity can be suppressed by designing the filter characteristic suitable for the radio communication system.

2 Claims, 9 Drawing Sheets

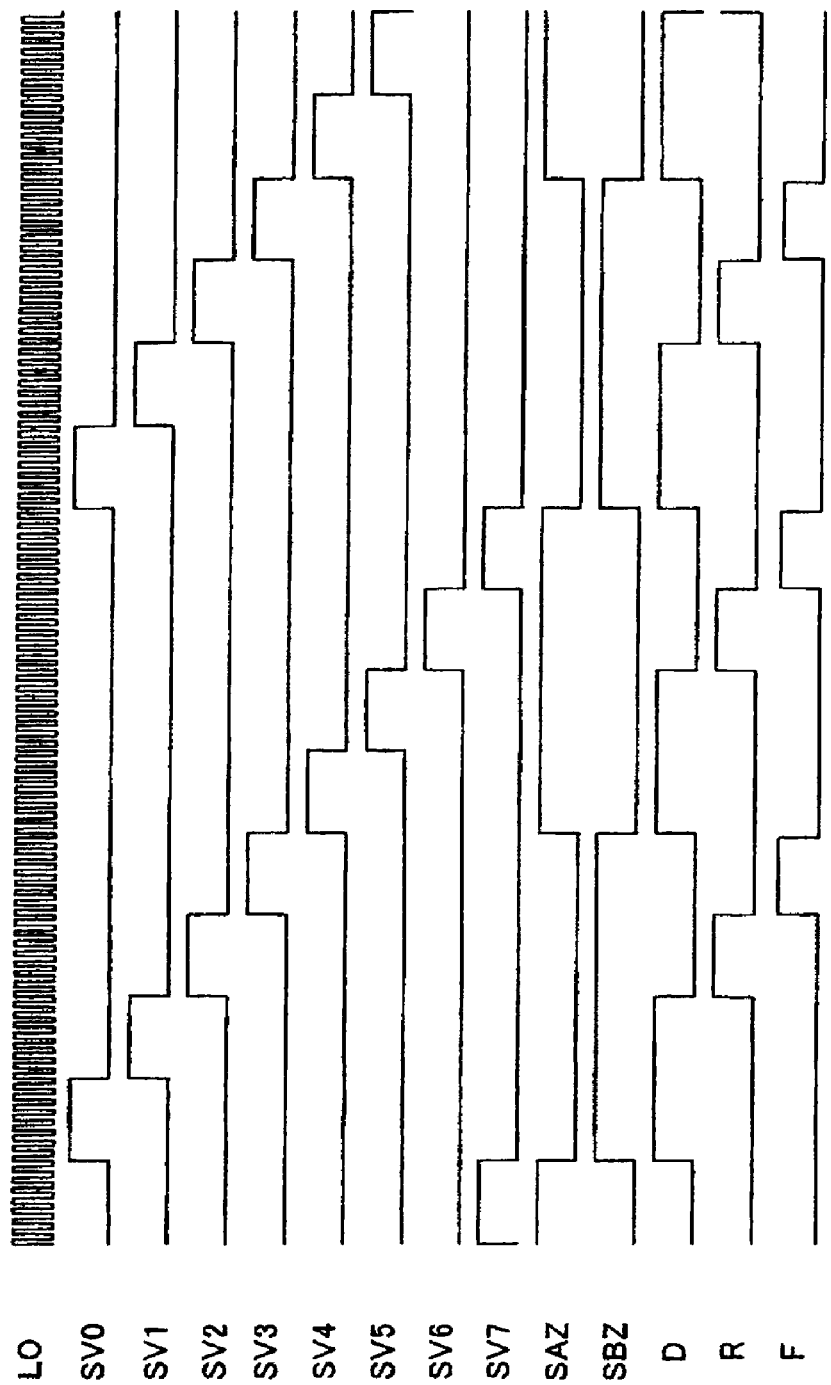

SAMPLING MIXER, FILTER DEVICE, AND RADIO DEVICE

This application is a division of U.S. patent application Ser. No. 12/532,530 filed Sep. 22, 2009, which is incorporated herein by reference in its entirety.

TECHNICAL FIELD

The present invention relates to a discrete filter device, a sampling mixer, and a' radio device, for executing a digital signal processing such as a filtering, or the like.

BACKGROUND ART

In the sampling mixer, signals that underwent a digital modulation are sampled by a sampling circuit, and thus a filter effect can be obtained by a switched capacitor built in the sampling circuit (for example, Patent Literature 1).

FIG. 6 is a circuit diagram of a sampling mixer 600 set forth in Patent Literature 1, and FIG. 7 is a timing chart of control signals of the sampling mixer 600.

In FIG. 6, the sampling mixer 600 includes a TA (transconductance amplifier) 1 for converting a received radio frequency (RF) signal into an RF current $i_{RF}$, an in-phase mixer section 2 for sampling the RF current $i_{RF}$ generated by TA 1, an opposite-phase mixer section 3 combined with the in-phase mixer section 2, and a DCU (digital control unit) 4 for generating control signals for the in-phase mixer section 2 and the opposite-phase mixer section 3.

The in-phase mixer section 2 includes a sampling switch 5, and a Ch (history capacitor) 6 for temporally integrating the signals sampled by the sampling switch 5 successively. Also, the in-phase mixer section 2 includes a plurality of Crs (rotate capacitors) 7 to 14 for repeating the integration and the discharge of the signals sampled by the sampling switch 5, and a Cb (buffer capacitor) 15 for buffering the signals discharged from respective Crs 7 to 14.

The in-phase mixer section 2 includes a damp switch 16 for discharging the signals held by respective Crs 7 to 14 to the Cb 15, a reset switch 17 for resetting the signals held on respective Crs 7 to 14 after the signal discharge, and a plurality of integrate switches 18 to 25 for connecting the Ch 6 sequentially to respective Crs 7 to 14.

The in-phase mixer section 2 includes a plurality of discharge switches 26 to 33 for connecting sequentially respective Crs 7 to 14 to the Cb 15, and a feedback switch 34 for controlling the input of a feedback signal from a DA (Digital-Analog) converter to the sampling mixer 600 side.

Next, while taking an operation of the in-phase mixer section 2 as an example, an operation of the sampling mixer 600 will be explained hereunder.

First, the RF current $i_{RF}$ is sampled by the sampling switch 5, and is discretized on a time axis to give a discrete signal.

The discrete signal is integrated sequentially by the Ch 6 and respective Crs 7 to 14 based on a SV0 signal to a SV7 signal, and the filtering and the decimation are applied to the resultant signals.

Thus, the effect of an 8-tap FIR (Finite Impulse Response) filter can be attained. A sampling rate at this time is decimated to ⅛. This is because a moving average is applied to the signals held in the eight integrate switches 18 to 25. Such filter is called a first-stage FIR filter. A transfer function of the first-stage FIR filter is expressed by following Expression.

[Formula 1]

$$H_{FIR1} = \frac{1 - z^{-8}}{1 - z^{-1}} \quad \text{(Expression 1)}$$

Also, since the Ch 6 connected sequentially to respective Crs 7 to 14 holds an output potential, the effect of an IIR (Infinite Impulse Response) filter can be attained. Such filter is called a first-stage IIR filter. A transfer function of the first-stage IIR filter is expressed by following Expression. Here, a capacitance value of the Ch6 is assumed as Ch, and capacitance values of respective Crs 7 to 14 are assumed as Cr, respectively.

[Formula 2]

$$H_{IIR1} = \frac{1}{Ch + Cr - Chz^{-1}} \quad \text{(Expression 2)}$$

Also, when an SBZ signal is input into gates of the discharge switches 26 to 29, all discharge switches 26 to 29 are turned ON in a high-level period of the SAZ signal. Then, the discrete signals integrated by respective Crs 7 to 10 are discharged simultaneously to the Cb 15 via the discharge switches 26 to 29 that are in an ON state.

After this discharge, then a D signal goes to a low level. Thus, the damp switch 16 is turned OFF, and the Cb 15 is disconnected from respective Crs 7 to 10. Then, an R signal goes to a high level. Thus, the reset switch 17 is turned ON, and the signals held in respective Cr 7 to 10 are reset.

Thus, the signals integrated by respective Crs 7 to 10 are discharged simultaneously to the Cb 15. Accordingly, the effect of a 4-tap FIR filter can be attained. A sampling rate at this time is decimated to ¼. This is because the signals integrated by four Cr 7 to 10 are moving-averaged to the Cb 15.

Also, the signals integrated by respective Crs 11 to 14 function similarly to the case of respective Crs 7 to 10 using an SAZ signal instead of the SBZ signal. Such filter is called a second-stage FIR filter. A transfer function of the second-stage FIR filter is expressed by following Expression.

[Formula 3]

$$H_{FIR2} = \frac{1}{4} \frac{1 - z^{-4}}{1 - z^{-1}} \quad \text{(Expression 3)}$$

Also, four Crs are connected to the Cb 15 in a group of four Crs 7 to 10 or four Crs 11 to 14. Accordingly, the effect of the IIR filter can be attained. Such filter is called a second-stage IIR filter. A transfer function of the second-stage IIR filter is expressed by following Expression. Here, a capacitance value of the Cb 15 is assumed.

[Formula 4]

$$H_{IIR2} = \frac{4Cr}{4Cr + Cb - Cbz^{-1}} \quad \text{(Expression 4)}$$

In this case, the opposite-phase mixer section 3 operates substantially similarly to the in-phase mixer section 2, except that the sampling is delayed by a ½ period rather than the in-phase mixer section 2.

As the sampling mixer 600 is constructed in this manner, an output signal of the sampling mixer 600 is given as the signal that passed through the first-stage FIR filter, the first-stage IIR filter, the second-stage FIR filter, and the second-stage IIR filter. A transfer function of the overall filter is given by a following Expression using the current converting expressions based on Expression (1), Expression (2), Expression (3), and Expression (4). Here, a transconductance of the TA1 is assumed as gm, and a frequency of the RF signal is assumed as $f_{RF}$.

[Formula 5]

$$H = \frac{gm}{\pi f_{RF}} H_{FIR1} H_{IIR1} H_{FIR2} H_{IIR2}$$
$$= \frac{gm}{\pi f_{RF}} \frac{1-z^{-8}}{1-z^{-1}} \frac{1}{(C_H+C_R)-C_H z^{-8}} \frac{1}{4}$$
$$\frac{1-z^{-32}}{1-z^{-8}} \frac{4C_R}{(4C_R+C_B)-C_B z^{-32}}$$

(Expression 5)

Next, the filter characteristics containing various filters mentioned above will be explained with reference to FIG. 8 hereunder. Here, it is assumed that a frequency of the LO signal is assumed as 2.4 GHz, the Ch 6 is assumed as 15 pF, the Cr 7 to 14 are assumed as 0.5 pF respectively, the Cb 15 is assumed as 15 pF, and the transconductance of the TA1 is assumed as 7.5 mS.

The characteristic of the first-stage FIR filter is shown in FIG. 8A, and the characteristic of the first-stage IIR filter is shown in FIG. 8B. Also, the characteristic of the second-stage FIR filter is shown in FIG. 8C, and the characteristic of the second-stage IIR filter is shown in FIG. 8D. Also, the characteristic of the overall sampling mixer 600 is shown in FIG. 8E.

In the sampling mixer 600 constructed in this manner, the signal that passed through four filters, i.e., the first-stage FIR filter, the first-stage IIR filter, the second-stage FIR filter, and the second-stage IIR filter, is output to the AD converter.
Patent Literature 1: JP-A-2004-289793 (pages 6 to 9, FIG. 3a, FIG. 3b, FIG. 4)

DISCLOSURE OF THE INVENTION

Problems that the Invention is to Solve

However, in the sampling mixer set forth in Patent Literature 1, the filter characteristic is decided by a ratio of capacitance values of Ch, Cr, and Cb, as given in Expression (5). Also, the sampling mixer in the background art possesses the filter characteristic that delays gently even in a desired band because the primary filters are connected in a cascade fashion.

As described above, the sampling mixer in the background art has such problems that neither the flat filter characteristic within a desired band nor the band-pass characteristic can be obtained, and therefore, a margin of design of the filter characteristic is low. Moreover, such a problem existed that the filter characteristic suitable for each radio system cannot be obtained and deterioration of a receiving sensitivity occurs easily.

The present invention has been made in view of such problems, and it is an object of the present invention to provide a sampling mixer, a filter device, and a radio device, capable of improving a margin of design of the filter characteristic in a desired band.

Means for Solving the Problems

A sampling mixer according to an aspect of the invention, includes: a first transconductance amplifier which converts a received signal into a current; a second transconductance amplifier which converts the received signal into a current, and has a transconductance that is an α-times transconductance of the first transconductance amplifier; a first sampling switch for sampling a signal that underwent the current conversion by the first transconductance amplifier; a second sampling switch for sampling a signal that underwent the current conversion by the second transconductance amplifier; a first history capacitor for integrating a signal that is sampled by the first sampling switch; a second history capacitor for integrating a signal that is sampled by the second sampling switch; a first rotate capacitor connected to the first history capacitor for a predetermined time, for integrating the signal converted into the current by the first transconductance amplifier; a second rotate capacitor connected to the second history capacitor for a predetermined time, for integrating the signal converted into the current by the second transconductance amplifier; a buffer capacitor for integrating the signal that is discharged from the first rotate capacitor; and a first discharge switch for discharging the signal that is integrated in the second rotate capacitor to the first rotate capacitor.

According to this configuration, the IIR filter using the signals that underwent the current conversion by using different transconductances is constructed. Therefore, the filter characteristic can be designed by a weighting of the transconductance in addition to a capacitance ratio.

In the sampling mixer according to the invention, the first discharge switch discharges the signal, which has already been integrated in the second rotate capacitor, to the first rotate capacitor at a same timing as a timing at which the first rotate capacitor integrates the signal that is sampled by the first sampling switch.

According to this configuration, the signal that is weighted by the transconductance of the second transconductance amplifier can be used as a transfer function of the first IIR filter that is constructed by the first rotate capacitor. Therefore, the filter characteristic of the first IIR filter can be controlled by the transconductance of the second transconductance amplifier.

In the sampling mixer according to the invention, the transconductance of the second transconductance amplifier is variable.

According to this configuration, the filter characteristic of the sampling mixer can be variably controlled by variably controlling the transconductance of the second transconductance amplifier.

A sampling mixer according to an aspect of the invention, includes: a transconductance amplifier which converts a received signal into a current; a first sampling switch connected to the transconductance amplifier, for discretizing the signal that is converted into the current on a time axis; a second sampling switch connected to the transconductance amplifier, for discretizing the signal that is converted into the current on a time axis in phase that is different from the first sampling switch by 180 degree; a first history capacitor for integrating a signal that is discretized by the first sampling switch; a second history capacitor for integrating a signal that is discretized by the second sampling switch; a first rotate capacitor connected to the first history capacitor for a predetermined time, for integrating the signal that is discretized by the first sampling switch; a second rotate capacitor connected to the second history capacitor for a predetermined time, for integrating the signal that is discretized by the second sampling switch; a buffer capacitor for integrating the signals discharged from the first and second rotate capacitors; a first discharge switch for discharging the signal integrated in the second rotate capacitor to the first rotate capacitor; and a second discharge switch for discharging the signal integrated in the first rotate capacitor to the second rotate capacitor.

According to this configuration, the second sampling switch discretizes the received signal in phase that is different from the first sampling switch by 180 degree. Therefore, the filter characteristic of $\alpha=-1$ can be implemented, so that not only the bandpass filter characteristic can be implemented but also a circuit scale can be reduced.

A filter device according to an aspect of the invention, includes: a first transconductance amplifier which converts a received signal into a current; a second transconductance amplifier which converts the received signal into a current, and has a transconductance that is an $\alpha$-times transconductance of the first transconductance amplifier; a first history capacitor for integrating a signal that underwent a current conversion by the first transconductance amplifier; a second history capacitor for integrating a signal that underwent the current conversion by the second transconductance amplifier; a first rotate capacitor connected to the first history capacitor for a predetermined time, for integrating the signal converted into the current by the first transconductance amplifier; a second rotate capacitor connected to the second history capacitor for a predetermined time, for integrating the signal converted into the current by the second transconductance amplifier; a buffer capacitor for integrating the signals that are discharged from the first and second rotate capacitors; and a first discharge switch for discharging the signal that is integrated in the second rotate capacitor to the first rotate capacitor.

According to this configuration, $\alpha$ can be set to a predetermined value, and therefore, the wide-band filter characteristic and the band-pass filter characteristic can be obtained, the filter characteristic suitable for the radio communication system can be designed, and deterioration of the receiving sensitivity can be suppressed.

In the filter device according to the invention, the first discharge switch discharges the signal, which has already been integrated in the second rotate capacitor, to the first rotate capacitor at a same timing as a timing at which the first rotate capacitor integrates the signal that underwent the current conversion by the first transconductance amplifier.

According to this configuration, the signal that is weighted by the transconductance of the second transconductance amplifier can be used as a transfer function of the first IIR filter that is constructed by the first rotate capacitor. Therefore, the filter characteristic of the first IIR filter can be controlled by the transconductance of the second transconductance amplifier.

In the filter device according to the invention, the transconductance of the second transconductance amplifier is variable.

According to this configuration, the filter characteristic can be variably controlled by variably controlling the transconductance of the second transconductance amplifier.

Further, a radio device according to the invention is a radio device equipped with the above-mentioned sampling mixer. Moreover, a radio device according to the invention is a radio device equipped with the above-mentioned filter device.

According to this configuration, the flat filter characteristic within a desired band and the band-pass characteristic can be obtained, and a margin of design of the filter characteristic can be enhanced. Therefore, the suitable filter characteristic can be obtained every radio system, and also deterioration of the receiving sensitivity can be prevented.

Advantages of the Invention

According to the present invention, two transconductance amplifiers or more having a transconductance different from each other are provided, and the IIR filter using signals that underwent the current conversion by using respective different transconductances is constructed. Therefore, the filter characteristic can be designed by a weighting of the transconductance in addition to a capacitance ratio. As a result, the wide-band filter characteristic and the band-pass filter characteristic can be obtained, and deterioration of the receiving sensitivity can be suppressed by designing the filter characteristic suitable for the radio communication system.

BRIEF DESCRIPTION OF THE DRAWINGS

FIG. 7 is a timing chart of control signals of the sampling mixer in the background art;

Figure 1:
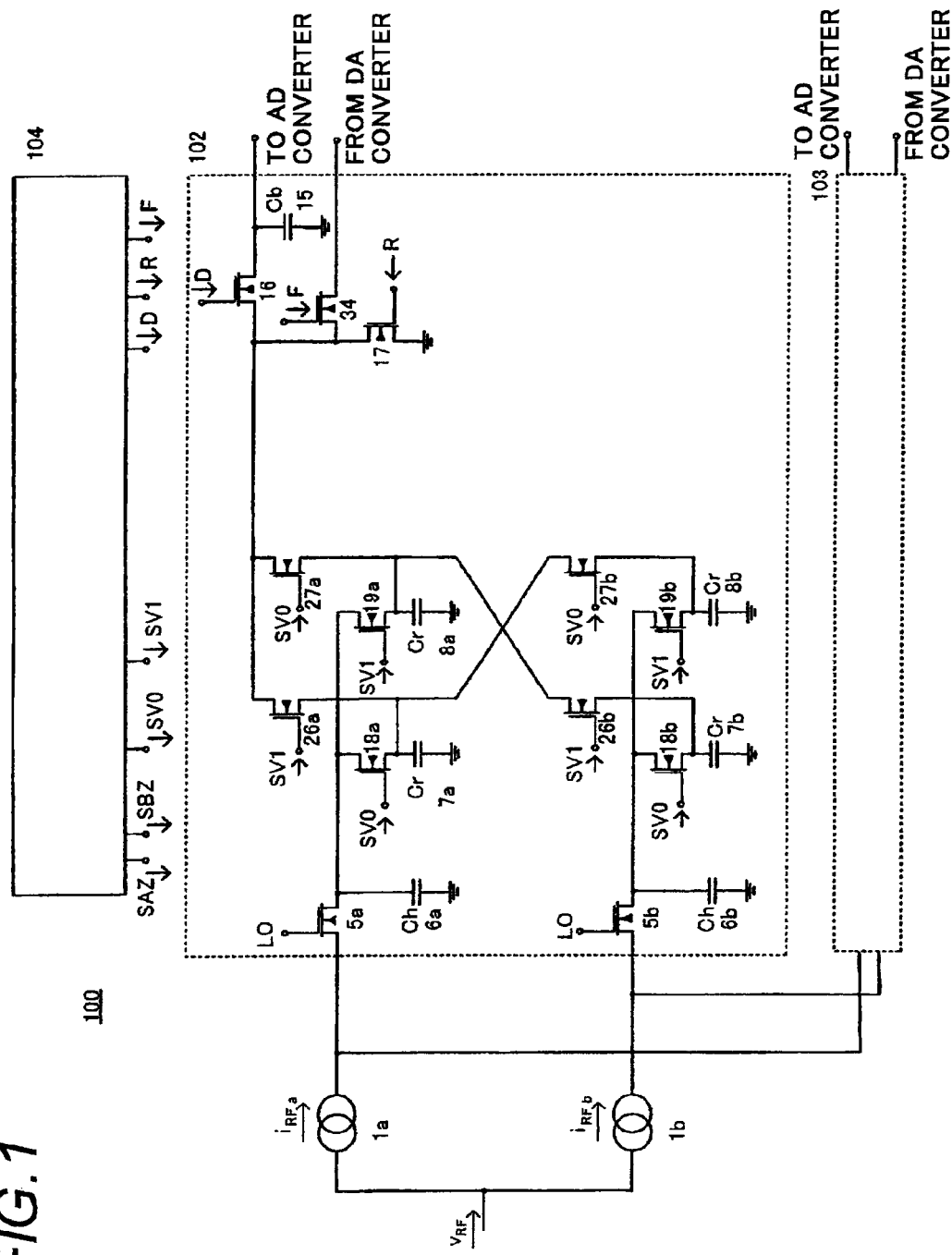
FIG. 1 is circuit diagram of a sampling mixer in Embodiment 1 of the present invention.

DESCRIPTION OF REFERENCE NUMERALS 1 transconductance amplifier
2, 102, 202 in-phase mixer section
3, 103 opposite-phase mixer section
4 digital control unit
5 sampling switch
6 history capacitor
7, 8, 9, 10, 11, 12, 13, 14 rotate capacitor
15 buffer capacitor
16 damp switch
17 reset switch
18, 19, 20, 21, 22, 23, 24, 25 integrate switch
26, 27, 28, 29, 30, 31, 32, 33 discharge switch
34 feedback switch
35 sampling switch
100, 200, 503, 504 sampling mixer
104 signal generator
500 radio device
501 antenna
502 low-noise amplifier
505 signal processor
600 sampling mixer in the background art

BEST MODE FOR CARRYING OUT THE INVENTION

Embodiment 1

FIG. 1 is a circuit diagram of a sampling mixer in Embodiment 1 of the present invention. In FIG. 1, a sampling mixer 100 includes a first transconductance amplifier: TA 1a, a second transconductance amplifier: TA 1b, an in-phase mixer section 102 connected to the TA 1a and the TA 1b, an opposite-phase mixer section 103 connected in parallel with the in-phase mixer section 102, and a signal generator 104 for generating a control signal for the in-phase mixer section 102 and the opposite-phase mixer section 103 respectively.

The in-phase mixer section 102 has a first sampling switch 5a, a second sampling switch 5b, a first history capacitor (Ch) 6a, a second history capacitor 6b, integrate switches 18a, 18b, 19a, 19b, discharge switches 26a, 26b, 27a, 27b, a first rotate capacitor (Cr) group 7a, 8a, a second rotate capacitor group 7b, 8b, a buffer capacitor (Cb) 15, a damp switch 16, a reset switch 17, and a feedback switch 34. Here, the discharge switch 26b is the first discharge switch that is used to discharge the signal being integrated in the first rotate capacitor Cr 8a to the second rotate capacitor Cr 7b, and the discharge switch 27b is the second discharge switch that is used to discharge the signal being integrated in the second rotate capacitor 8b to the first rotate capacitor Cr 7a.

The first history capacitor Ch 6a is connected to the first transconductance amplifier: TA 1a via the first sampling switch 5a. The Cr 7a is connected to the Ch 6a via the integrate switch 18a, and is connected to the Cb 15 via the discharge switch 26a and the damp switch 16. The Cr 8a is connected to the Ch 6a via the integrate switch 19a, and is connected to the Cb 15 via the discharge switch 27a and the damp switch 16.

The second history capacitor Ch 6b is connected to the second transconductance amplifier: TA 1b via the second sampling switch 5b. The Cr 7b is connected to the Ch 6b via the integrate switch 18b, and is connected to the Cr 8a via the discharge switch 26b. The Cr 8b is connected to the Ch 6b via the integrate switch 19b, and is connected to the Cr 7a via the discharge switch 27b.

In the present embodiment, the sampling switches 5a, 5b, the integrate switches 18a, 18b, 19a, 19b, the discharge switches 26a, 26b, 27a, 27b, the damp switch 16, the reset switch 17, and the feedback switch 34 may be formed of an n-type FET respectively, alternatively, they may be formed of a p-type FET respectively. Otherwise, they may be formed of a CMOS respectively.

An LO signal is input into gates of the sampling switches 5a, 5b. An SV0 signal is input to gates of the integrate switches 18a, 18b and the discharge switches 27a, 27b from the signal generator 104. An SV1 signal is input to gates of the integrate switches 19a, 19b and the discharge switches 26a, 26b from the signal generator 104.

Figure 2:
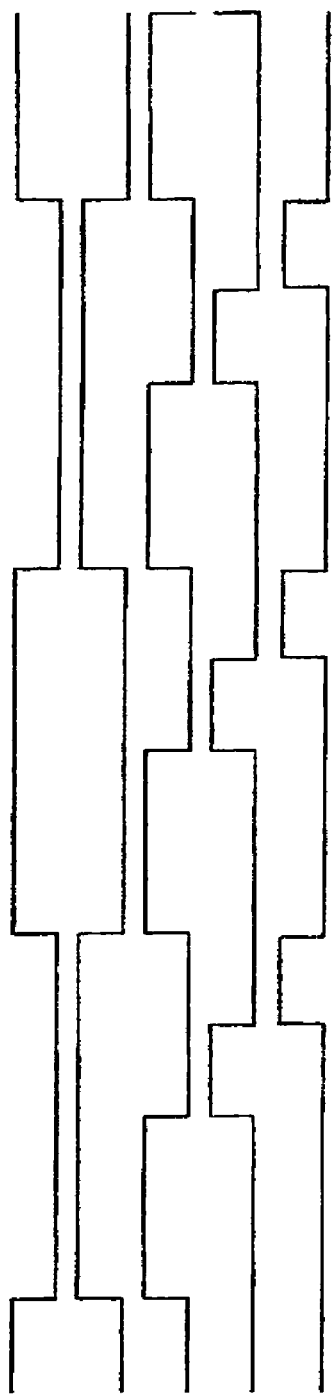
FIG. 2 is a timing chart of control signals of the sampling mixer in Embodiment 1 of the present invention.

FIG. 2 is a timing chart of control signals of the sampling mixer in Embodiment 1 of the present invention. A D signal, an R signal, and an F signal are input into a gate of the damp switch 16, a gate of the reset switch 17, and a gate of the feedback switch 34 respectively. The opposite-phase mixer section 103 has the same configuration as the in-phase mixer section 102, and a LOB signal whose phase is different from the LO signal by 180 degree is input into the sampling switch.

An operation of the sampling mixer 100 will be explained by using the in-phase mixer section 102 hereunder. A voltage receiving signal $V_{RF}$ is converted into current receiving signals $i_{RFa}$, $i_{RFb}$ by TA 1a, TA 1b, respectively. The current receiving signal $i_{RFa}$ is sampled by the sampling switch 5a, and is integrated in the Ch 6a, the Cr 7a, and the Cr 8b when the SV0 signal is high.

Also, the current receiving signal $i_{RFb}$ is sampled by the sampling switch 5b, and is integrated in the Ch 6b and the Cr 7b when the SV0 signal is high. Then, when the SV1 signal goes to high, the signal integrated in the Cr 7a is discharged to the Cb 15.

When the SV1 signal is high, the current receiving signal $i_{RFa}$ is sampled by the sampling switch 5a and is integrated in the Ch 6a, the Cr 8a, and the Cr 7b. Also, the current receiving signal $i_{RFb}$ is sampled by the sampling switch 5b and is integrated in the Ch 6b and the Cr 8b. Then, when the SV0 signal goes to high, the signal integrated in the Cr 8a is discharged to the Cb 15.

Subsequently, respective operations are repeated in compliance with the control signals being generated in the signal generator 104. The first IIR filter (main system) is constructed by the Ch 6a, the Cr 7a, and the Cr 8a, the second IIR filter (dummy circuit system) is constructed by the Ch 6b, the Cr 7b, and the Cr 8b, and the third IIR filter is constructed by the Cr 7a, the Cr 8a, and the Cb 15.

During this operation, when the received signal sampled by the sampling switch 5a is integrated by the Ch 6a, the Cr 7a, and the Cr 8b, a part of charges that have already been integrated in the Cr 8b (the received signal that is sampled via the sampling switch 5b when the SV1 signal is high) is discharged to the Ch 6a and the Cr 7a via the discharge switch 27b. That is, the Ch 6a, the Cr 7a, and the Cr 8b share the received signal being input from the sampling switch 5a, the charge that has already been integrated in the Ch 6a, and the charge that has already been integrated in the Cr 8b. In this manner, the technology to share the charge with a plurality of capacitors is also called a "charge sharing".

Similarly, when the received signal sampled by the sampling switch 5a is integrated by the Ch 6a, the Cr 8a, and the Cr 7b, a part of received signals that have already been integrated in the Cr 7b (the received signal that is sampled via the sampling switch 5b when the SV0 signal is high) is discharged to the Ch 6a and the Cr 8a via the discharge switch 26b. That is, the Ch 6a, the Cr 8a, and the Cr 7b share the received signal being input from the sampling switch 5a, the charge that has already been integrated in the Ch 6a, and the charge that has already been integrated in the Cr 7b. In this manner, the technology to share the charge with a plurality of capacitors is also called a "charge sharing". A quantity of charges integrated in respective capacitors after the charge sharing is decided by a capacitance ratio of a plurality of capacitors that share the charge with each other.

Therefore, since the charge is discharged from the second IIR filter (dummy circuit system) to the first IIR filter (main system), the signal obtained by weighting the transfer function of the IIR filter of the first IIR filter (main system) constructed by the Ch 6a, the Cr 7a, and the Cr 8a with the transconductance of the transconductor: TA 1b of the dummy circuit system can be employed. Namely, the filter characteristic of the first IIR filter (main system) can be controlled by controlling a value of the transconductance of the transconductor: TA 1b of the dummy circuit system.

The transfer function of the first IIR filter at this time can be derived as follows. Suppose that the charge being output from the sampling switch 5a is q(t), the voltage of the Ch 6a after q(t) is input is x(t), the charge being output from the sampling switch 5b is α×q(t), the voltage of the Ch 6b after α×q(t) is input is y(t), the capacitance value of the Ch 6a, 6b is Ch, and the capacitance value of the Cr 7a, 7b, 8a, 8b is Cr, the charge conservation expressions are given as follows.

[Formula 6]

$$Ch \cdot x(t-1) + Cr \cdot y(t-1) + q(t) = (Ch + 2Cr) \cdot x(t) \quad \text{(Expression 6)}$$

[Formula 7]

$$Ch \cdot y(t-1) + Cr \cdot x(t-1) + \alpha \cdot q(t) = (Ch + Cr) \cdot y(t) \quad \text{(Expression 7)}$$

From Expressions 6, 7, a transfer function H after the z-transformation is given as follows.

[Formula 8]

$$H = \frac{(Ch + Cr - Ch \cdot z^{-1}) + \alpha \cdot Cr \cdot z^{-1}}{(Ch + Cr - Ch \cdot z^{-1})} \quad \text{(Expression 8)}$$
$$(Ch + 2Cr - Ch \cdot z^{-1}) - Cr^2 \cdot z^{-2}$$

Next, an example of analysis of the filter characteristic is shown. Suppose that the transconductance of the TA 1a is 3 mS, a frequency of the LO signal is 2.4 GHz, the capacitance value of the Ch 6a, 6b is 15 pF, the capacitance value of the Cr 7a, 7b, 8a, 8b is 0.2 pF, and the capacitance value of the Cb is 15 pF, the filter characteristic when α is changed is shown in FIG. 3.

Figure 3:
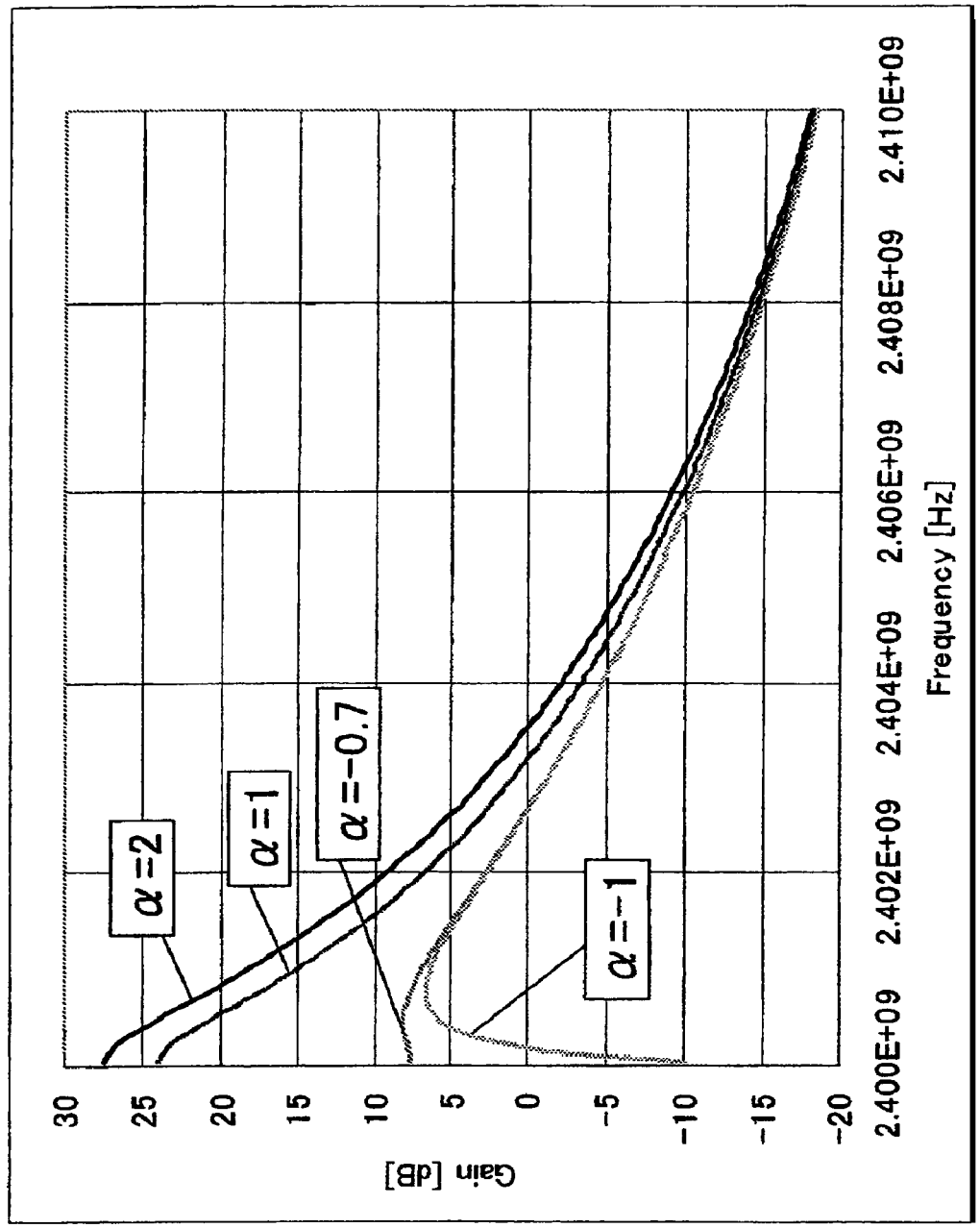
FIG. 3 is a characteristic chart of the sampling mixer in Embodiment 1 of the present invention.

In FIG. 3, the filter characteristic in the case of α=1 is the same characteristic as the configuration in the background art. The filter characteristic becomes sharp when α is increased, while a level of DC after the frequency conversion (In FIG. 3, 2.4 GHz) when α is decreased. The flat characteristic can be obtained at α=-0.7, and the characteristic becomes an attenuation pole at α=-1. The actual circuit can be expressed by setting a negative value α to the opposite phase to the TA 1a.

The filter characteristic at α=-0.7 enables an expansion of the passing band, and the filter characteristic at α=-1 enables the implementation of the band-pass characteristic. Both filter characteristics cannot be achieved by the background-art sampling mixer whose filter characteristic is decided by a capacitance ratio of the capacitors. In this manner, according to the configuration of the present embodiment, the filter characteristic can be set by using a ratio α of the transconductances of the main system and the dummy circuit system in addition to the capacitance ration of the capacitors that share the charge mutually, and therefore a margin of design of the filter can be improved remarkably rather than the sampling mixer having the conventional configuration.

Also, in the present embodiment, the capacitance value of the Ch 6a, 6b is set to Ch=15 pF, but values other than this value may be set. Also, the Ch 6a and the Ch 6b may have a different value respectively. Also, in the present embodiment, the capacitance value of the Cr 7a, 7b, 8a, 8b is set to Cr=0.2 pF, but values other than this value may be set. Also, the Cr 7a, 7b, 8a, 8b may have a different value respectively.

Figure 9:
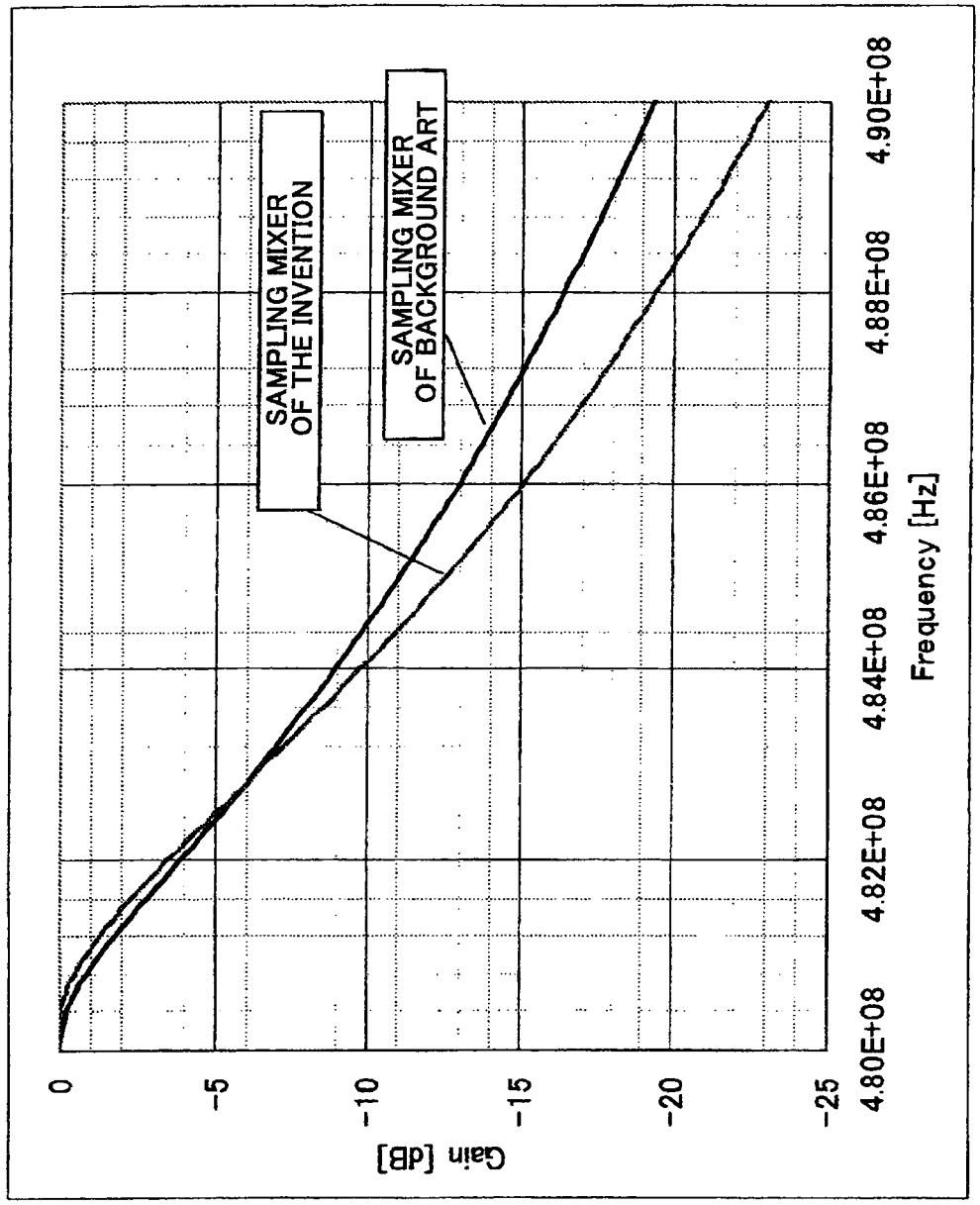
FIG. 9 is a chart showing an example of a filter characteristic of the sampling mixer corresponding to the reception of the digital terrestrial television broadcasting (ISDB-T, 13 segments).

Here, as a concrete example, the filter characteristic of the sampling mixer corresponding to the reception of the digital terrestrial television broadcasting (ISDB-T, 13 segments) is shown in FIG. 9. The frequency of the LO signal is set to 480 MHz, and the gain is normalized. In the direct conversion system, the band of the received signal is within of 2.8 MHz from the frequency of the LO signal. In the characteristic example, a deviation of the filter characteristic within the band of the received signal is designed as 6 dB. Respective set values at this time are Ch=8 pF, Cr=0.1 pF, Cb=2.7 pF, and α=-0.65.

Also, the filter characteristic designed similarly in the sampling mixer in the prior art is shown in FIG. 9. Respective set values at this time are Ch=4.5 pF, Cr=0.1 pF, and Cb=1 pF.

When focusing attention on the filter characteristic out of the band of the received signal, it is appreciated that such filter characteristic is attenuated more largely in the sampling mixer in the present embodiment. As a result, the signal of the adjacent channel acting as the jamming wave (the range of 3.2 to 8.8 MHz from the frequency of the LO signal) can be attenuated more largely, and deterioration of the receiving sensitivity can be suppressed.

As explained above, according to the sampling mixer of the present embodiment, the IIR filter is constructed by using the signals that are current-converted by the first and second transconductance amplifiers whose transconductance is different mutually. Therefore, the filter characteristic can be designed by the weighting of the transconductance (ratio of the transconductances between the main system and the dummy circuit system) in addition to the capacitance ratio of the capacitors that share the charge. As a result, the wide-band filter characteristic and the band-pass filter characteristic can be obtained, and deterioration of the receiving sensitivity can be suppressed by designing the filter characteristic suitable fro the radio communication system.

Also, the filter characteristic of the sampling mixer 100 may be controlled variably or switched by controlling variably or switching the transconductance of the transconductance amplifier: TA 1b of the dummy circuit system. The variable control or the switching control of the transconductance can be performed by switching an area (number) of transistors constituting TA or controlling the current thereof.

Also, in the present embodiment, the frequency conversion is executed by using the sampling switches 5a, 5b. Alternatively, the baseband filter device in which the sampling switch is omitted and which uses as the baseband signal as the input may be employed.

Embodiment 2

Figure 4:
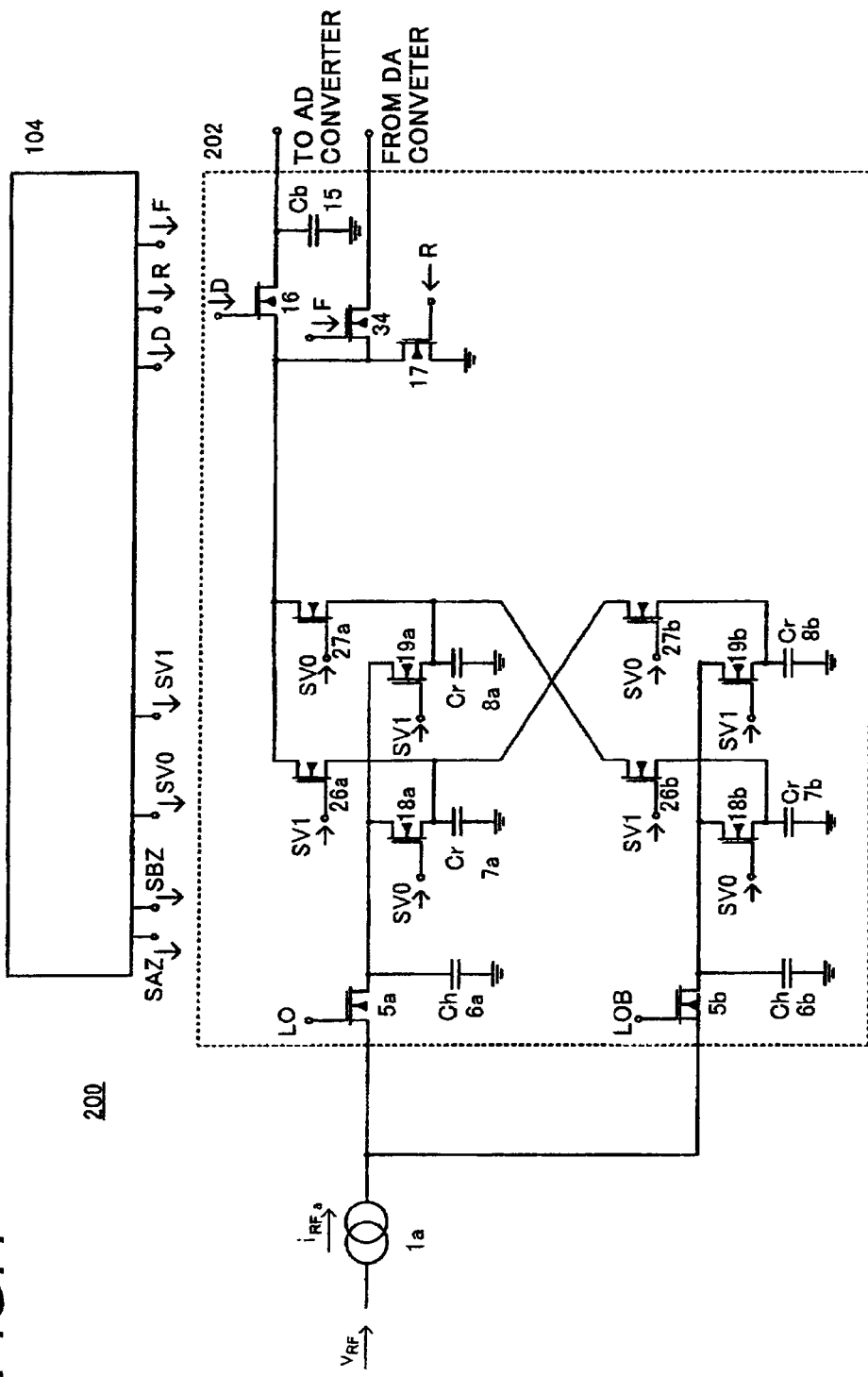
FIG. 4 is a circuit diagram of a sampling mixer in Embodiment 2 of the present invention.

FIG. 4 is a circuit diagram of a sampling mixer 200 in Embodiment 2 of the present invention. Only a difference from Embodiment 1 will be explained hereunder.

In the present embodiment, the opposite-phase mixer section 103, TA 1b shown in Embodiment 1 (FIG. 1) are not provided, and the output from TA 1a is input into the sampling switches 5a and 5b in an in-phase mixer section 202. That is, in the present embodiment, the sampling switch 5b is connected to TA 1a, and the LOB signal whose phase is different from the LO signal by 180 degree is input. Accordingly, TA 1a can execute the operation that is weighted by α=-1. A transfer function at this time is given as follows.

[Formula 9]

$$H = \frac{(Ch + Cr - Ch \cdot z^{-1}) - Cr \cdot z^{-1}}{(Ch + Cr - Ch \cdot z^{-1})} \quad \text{(Expression 9)}$$
$$(Ch + 2Cr - Ch \cdot z^{-1}) - Cr^2 \cdot z^{-2}$$

As explained as above, according to the sampling mixer of the present embodiment, not only the bandpass filter characteristic in Embodiment 1 can be implemented but also a circuit scale can be reduced.

Embodiment 3

Figure 5:
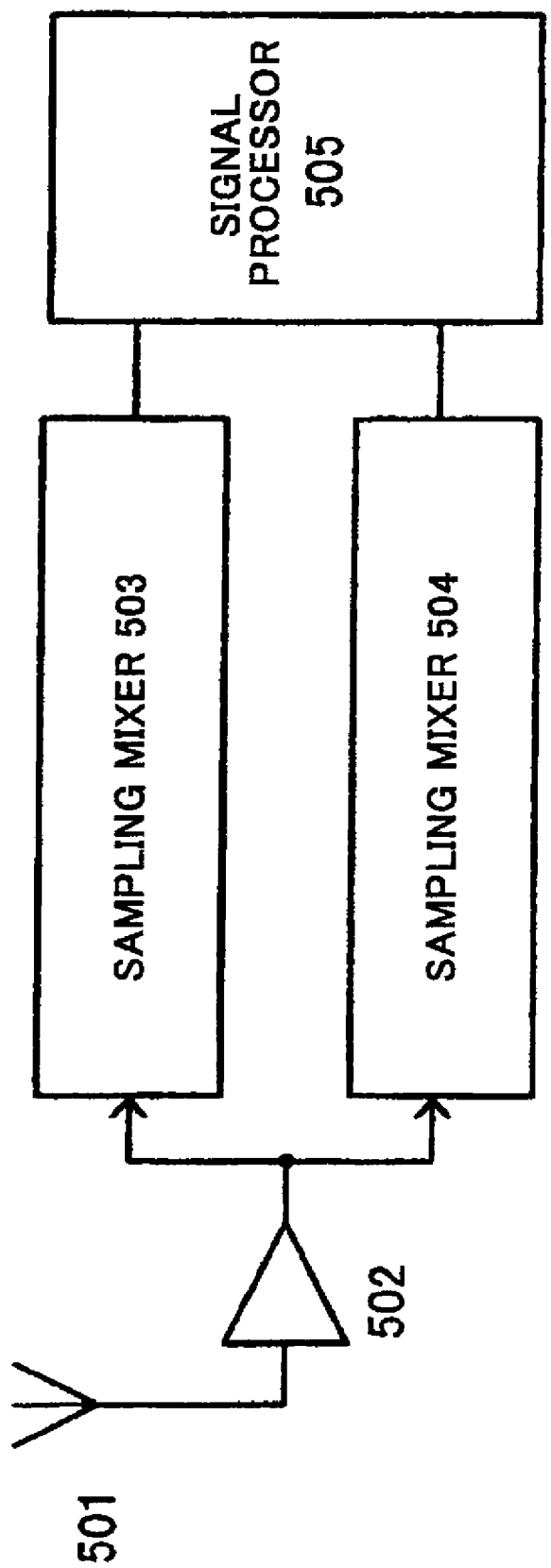
FIG. 5 is a block diagram of a radio device in Embodiment 3 of the present invention.
Figure 6:
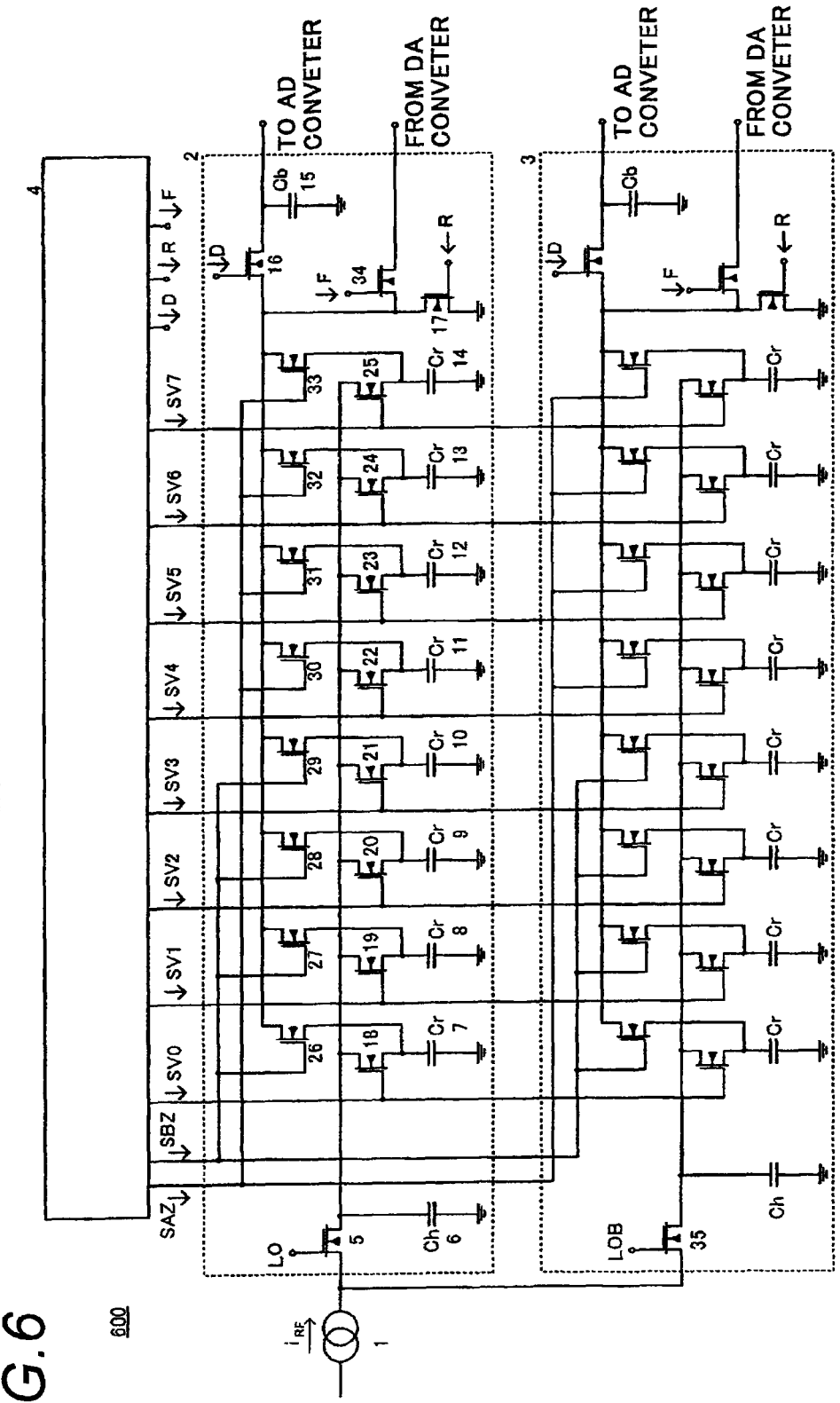
FIG. 6 is a circuit diagram of a sampling mixer in the background art.
Figure 8B:
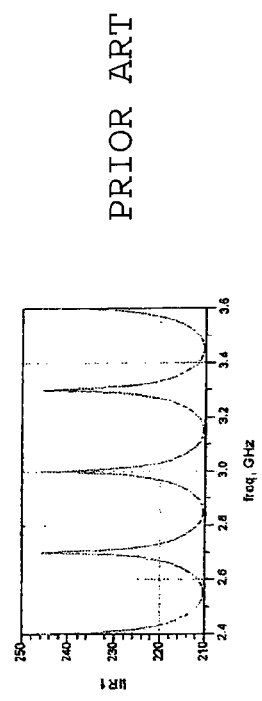
FIGS. 8A to 8E are characteristic charts of the sampling mixer in the background art.
Figure 8D:
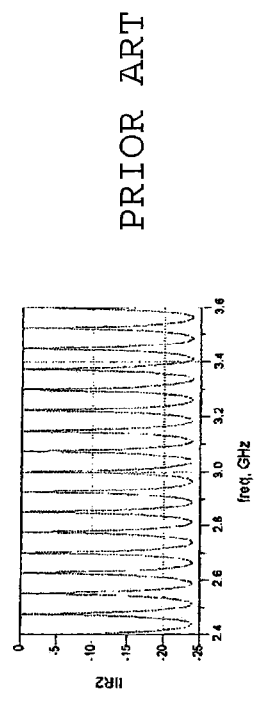
Figure 8A:
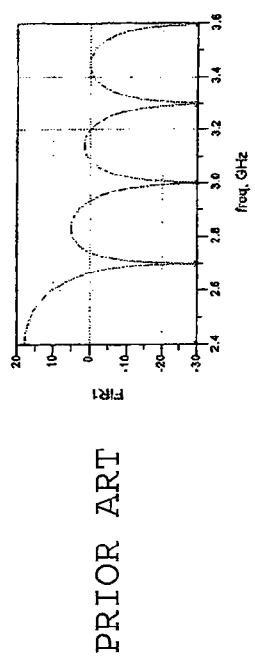
Figure 8C:
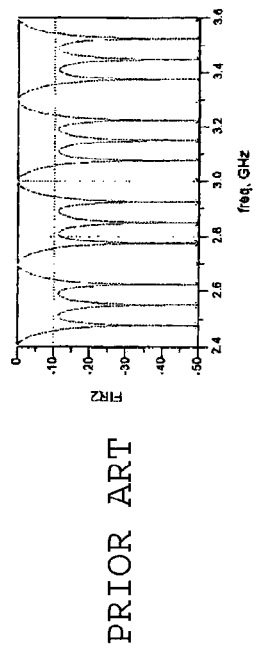
Figure 8E:
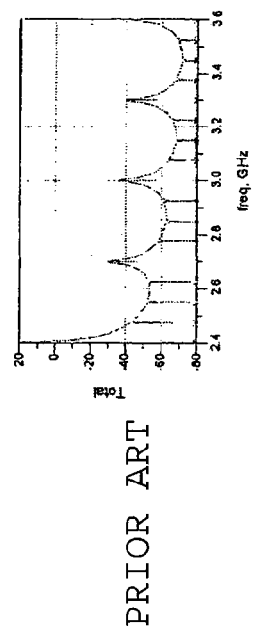

In the present embodiment, a radio device using the sampling mixer explained in Embodiment 1 or 2 will be explained hereunder. FIG. 5 is a block diagram of a radio device 500 in Embodiment 3 of the present invention. In FIG. 5, an antenna 501 and a low-noise amplifier 502 are connected. The low-noise amplifier 502 is connected to either of sampling mixers 503, 504 that are the sampling mixers explained in Embodiments 1 and 2. The sampling mixers 503, 504 are connected to a signal processor 505. A transmitting section is not illustrated.

An operation of the radio device 500 constructed in this manner at a time of reception will be explained hereunder. In the radio device 500 of the present embodiment, the received signal received by the antenna is amplified by the low-noise amplifier 502, and the amplified signal is output to the sampling mixers 503, 504. The sampling mixers 503, 504 output the received signal being amplified by the low-noise amplifier 502 to the signal processor 505 as the baseband signal that underwent the frequency conversion and was discretized on a time axis.

A difference between the sampling mixer 503 and the sampling mixer 504 resides in that the sampling timing by the sampling switch is deviated in phase by 90 degree. Accordingly, the received signal is quadrature-demodulated. The signal processor 505 processes the input baseband signal, and outputs sound, data, etc. to the user.

As explained above, the filter characteristic suitable for the radio system in which the radio device 500 holds the communication can be implemented by using the sampling mixers 503, 504. Therefore, deterioration of the receiving sensitivity of the radio device 500 can be suppressed. Also, in the present embodiment, the radio device using the sampling mixers is employed. But the filter device may be employed without use of the sampling switch.

The present invention is explained in detail with reference to the particular embodiments. But it is obvious for those skilled in the art that various variations and modifications can be applied without departing from a spirit and a scope of the present invention.

This application is based upon Japanese Patent Application (Patent Application No. 2007-089446) filed on Mar. 29, 2007; the contents of which are incorporated herein by reference.

INDUSTRIAL APPLICABILITY

The present invention possesses such an advantage that, since the IIR filter employing the signal that is subjected to the current conversion by using the different transconductances is constructed, the filter characteristic can be designed by the weighting of the transconductance in addition to the capacitance ratio, and is useful to the discrete filter device for applying the digital signal processing such as the filtering, or the like, the sampling mixer, the radio device, and the like.

The invention claimed is:

1. A sampling mixer, comprising:
   a transconductance amplifier which converts a received signal into a current;
   a first sampling switch connected to the transconductance amplifier, for discretizing the signal that is converted into the current on a time axis;
   a second sampling switch connected to the transconductance amplifier, for discretizing the signal that is converted into the current on a time axis in phase that is different from the first sampling switch by 180 degree;
   a first history capacitor for integrating a signal that is discretized by the first sampling switch;
   a second history capacitor for integrating a signal that is discretized by the second sampling switch;
   a first rotate capacitor connected to the first history capacitor for a predetermined time, for integrating the signal that is discretized by the first sampling switch;
   a second rotate capacitor connected to the second history capacitor for a predetermined time, for integrating the signal that is discretized by the second sampling switch;
   a buffer capacitor for integrating the signals discharged from the first and second rotate capacitors;
   a first discharge switch for discharging the signal integrated in the second rotate capacitor to the first rotate capacitor; and
   a second discharge switch for discharging the signal integrated in the first rotate capacitor to the second rotate capacitor.

2. A radio device equipped with the sampling mixer set forth in claim 1.

* * * * *